United States Patent
Kim (10) Patent No.: US 7,274,185 B2
(45) Date of Patent: Sep. 25, 2007

(54) METHODS OF GENERATING INTERNAL CLOCK SIGNALS FROM EXTERNAL CLOCK SIGNALS AND OF MEASURING THE FREQUENCY OF EXTERNAL CLOCK SIGNALS AND RELATED FREQUENCY MEASURING CIRCUITS AND SEMICONDUCTOR MEMORY DEVICES

(75) Inventor: Hyun-Jin Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 11/184,616

(22) Filed: Jul. 19, 2005

(65) Prior Publication Data
US 2006/0017429 A1 Jan. 26, 2006

(30) Foreign Application Priority Data
Jul. 20, 2004 (KR) .............. 10-2004-0056602

(51) Int. Cl.
*G11C 27/00* (2006.01)
*H03D 13/00* (2006.01)
*G01R 23/02* (2006.01)

(52) U.S. Cl. .............. 324/76.61; 327/42; 327/46

(58) Field of Classification Search .......... 324/76.61, 324/76.55, 76.52, 76.39, 76.11; 327/42, 327/46, 291, 146, 156; 331/1 A, 25, 44
See application file for complete search history.

(56) References Cited

U.S. PATENT DOCUMENTS

| 5,541,536 | A | * | 7/1996 | Rajivan | 326/98 |
| 6,081,143 | A | * | 6/2000 | Ho et al. | 327/166 |
| 6,337,589 | B1 | * | 1/2002 | Ooishi | 327/156 |
| 6,621,352 | B2 | * | 9/2003 | Matsumoto et al. | 331/1 A |
| 6,940,937 | B2 | * | 9/2005 | Xiu et al. | 375/376 |
| 2002/0016385 | A1 | | 2/2002 | Nakano et al. | 523/160 |
| 2002/0030520 | A1 | * | 3/2002 | Ooishi | 327/156 |
| 2005/0028016 | A1 | * | 2/2005 | Matsushima et al. | 713/322 |

FOREIGN PATENT DOCUMENTS

| JP | 2000-221239 | 8/2000 |
| KR | 1020020053492 | 7/2002 |

* cited by examiner

*Primary Examiner*—Vincent Q. Nguyen
*Assistant Examiner*—Hoai-An D. Nguyen
(74) *Attorney, Agent, or Firm*—Myers Bigel Sibley & Sajovec (57) ABSTRACT

Pursuant to certain embodiments of the present invention, methods of generating an internal clock signal in a semiconductor memory device are provided in which the frequency of an external clock signal is measured. A CAS latency value of the semiconductor memory device is automatically set based at least in part on the measured frequency of the external clock signal. The automatically set CAS latency value is then used to generate the internal clock signal from the external clock signal. In these methods, the delay of a delay lock loop of the semiconductor memory device may be based at least in part on the automatically set CAS latency value. The internal clock signal may be generated from the external clock signal using the delay lock loop. Circuits and methods for measuring the frequency of the external clock signal are also provided.

28 Claims, 9 Drawing Sheets

| CKref | | | | | | | | | | | | | | | | |
|---|---|---|---|---|---|---|---|---|---|---|---|---|---|---|---|---|
| PL4 | 0 | 1 | 0 | 1 | 0 | 1 | 0 | 1 | 0 | 1 | 0 | 1 | 0 | 1 | 0 | 1 |
| PL3 | 0 | 0 | 1 | 1 | 0 | 0 | 1 | 1 | 0 | 0 | 1 | 1 | 0 | 0 | 1 | 1 |
| PL2 | 0 | 0 | 0 | 0 | 1 | 1 | 1 | 1 | 0 | 0 | 0 | 0 | 1 | 1 | 1 | 1 |
| PL1 | 0 | 0 | 0 | 0 | 0 | 0 | 0 | 0 | 1 | 1 | 1 | 1 | 1 | 1 | 1 | 1 |

METHODS OF GENERATING INTERNAL CLOCK SIGNALS FROM EXTERNAL CLOCK SIGNALS AND OF MEASURING THE FREQUENCY OF EXTERNAL CLOCK SIGNALS AND RELATED FREQUENCY MEASURING CIRCUITS AND SEMICONDUCTOR MEMORY DEVICES

CROSS-REFERENCE TO RELATED APPLICATION

This application claims the benefit under 35 U.S.C. § 119 of Korean Patent Application No. 2004-56602, filed Jul. 20, 2004, the disclosure of which is hereby incorporated herein by reference in its entirety.

FIELD OF THE INVENTION

The present invention relates to semiconductor memory devices, and more particularly, methods of generating internal clock signals in semiconductor memory devices and related methods.

BACKGROUND OF THE INVENTION

Many semiconductor memory devices use one or more internal clock signals to, for example, control operations of the device. These internal clock signals may be generated from one or more external clock signals. However, the performance of certain circuits within the semiconductor memory device may be impacted by the frequency of the clock signals that are used. As such, it may be desirable to have circuits in a semiconductor device operate in one way when a clock signal having a first frequency is used and act in a different way when a clock signal having a different frequency is used.

For example, when a delay locked loop (DLL) is used to generate an internal clock signal that is synchronized with an external clock signal, the internal clock signal typically can be synchronized with the external clock signal even if the delay circuit has a short delay time, so long as the external clock signal has a high frequency. However, a delay circuit having a relatively long delay time should be used to synchronize the internal clock signal with the external clock signal when the external clock signal has a low frequency.

Figure 1:
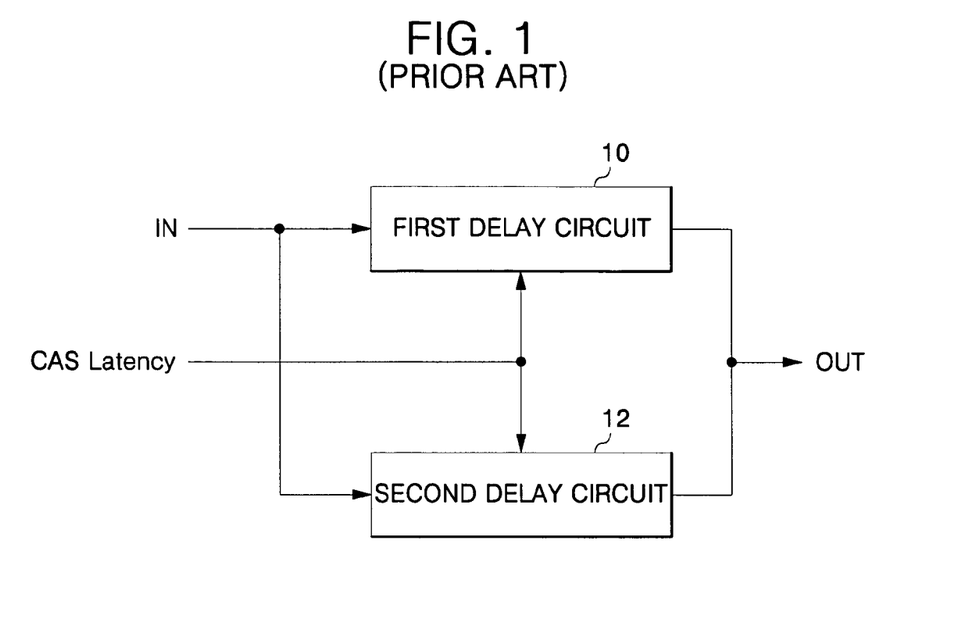
FIG. 1 is a block diagram of a delay circuit of a conventional semiconductor memory device.

In conventional semiconductor memory devices, a CAS latency (CL) value that is set, for example, by a user of the device may provide information about the frequency of the external clock signal. FIG. 1 is a block diagram of a circuit that may be used in a conventional semiconductor memory device to generate an internal clock signal from an external clock signal. The circuit of FIG. 1 provides for different delays that may be implemented based on the frequency of the external clock signal.

As shown in FIG. 1, first and second delay circuits 10 and 12, which are selected by a CAS Latency (CL) value, may be used to delay an input signal IN (i.e., the external clock signal that is to be used to generate the internal clock signal) by different predetermined amounts. The first and second delay circuits 10 and 12 output the delayed input signal as an output signal OUT. In conventional semiconductor memory device, the CL value is set based on the frequency of the input clock signal. Thus, the circuit of FIG. 1 varies the amount which the external clock signal is delayed to produce the internal clock signal based on the frequency of the external clock signal as reflected by the CL value. Accordingly, when a CL value is set by the user in response to the frequency of the external clock signal, the circuit illustrated in FIG. 1 can generate the output signal OUT at a different time by selecting one of the first delay circuit 10 and the second delay circuit 12 in response to the CL value.

Figure 2:
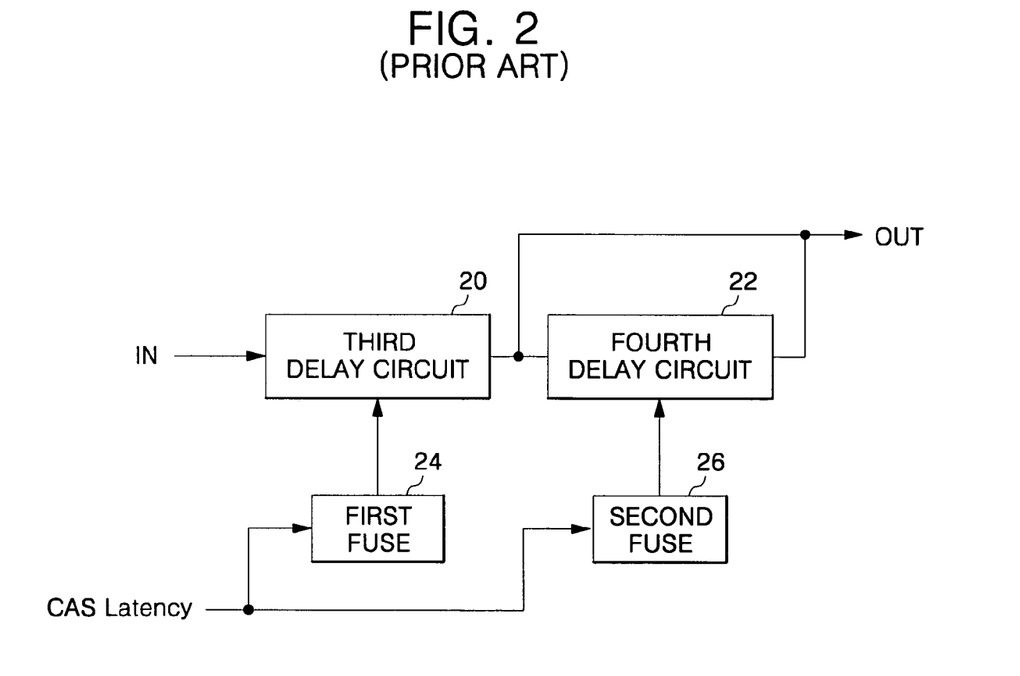
FIG. 2 is a block diagram of a delay circuit of a conventional memory device that illustrates a method of adjusting the delay time of the circuit in response to the frequency of a clock signal.

FIG. 2 is a block diagram illustrating a method of adjusting the delay time of a delay circuit in response to the frequency of an external clock signal in a DLL of a conventional semiconductor memory device. In the delay circuit of FIG. 2, each of the third and fourth delay circuits 20 and 22 may be composed of one or more delay elements. The third and fourth delay circuits may have the same, or different, delay times.

As noted above, a DLL is often used to synchronize the internal clock signal with the external clock signal in a semiconductor memory device. As also discussed above, the internal clock signal can typically be synchronized with the external clock signal even when the DLL has a short delay time if the input clock signal has a high frequency. However, the DLL may need to have a relatively long delay time if the input clock signal has a low frequency.

In the DLL circuit of FIG. 2, the CL value set by the user may be used to set/cut the first and second fuses 24 and 26. When the frequency of the clock signal is relatively high, the CL value may be chosen so that only the second fuse 26 is cut, so that the internal clock signal will be generated by the third delay circuit 20, and the fourth delay circuit 22 is not used. In this manner, the delay time associated with the delay circuit is relatively shorter. In contrast, when the frequency of the clock signal is relatively low, the CL value may be chosen so that neither the first fuse 24 nor the second fuse 26 are cut. As a result, the internal clock signal is generated through both the third delay circuit 20 and the fourth delay circuit 22, thereby making the delay time relatively longer.

As the CL value may be used to convey information about the frequency of the clock signal, the CL value may need to be changed if the frequency of the clock signal that is to be input to the semiconductor memory device is changed. If the CL value is not set correctly by the user, the semiconductor memory device may not work properly.

SUMMARY OF THE INVENTION

Pursuant to embodiments of the present invention, methods of generating an internal clock signal in a semiconductor memory device and methods of measuring the frequency of an external clock signal are provided, as well as frequency measuring circuits that can automatically sense information about the frequency of an input clock signal.

Pursuant to certain embodiments of the present invention, methods of generating an internal clock signal in a semiconductor memory device are provided in which the frequency of an external clock signal is measured. A CAS latency value of the semiconductor memory device is automatically set based on the measured frequency of the external clock signal. The automatically set CAS latency value may then be used to generate the internal clock signal from the external clock signal. In these methods, the delay of a delay lock loop of the semiconductor memory device may be based on the automatically set CAS latency value. The internal clock signal may be generated from the external clock signal using the delay lock loop.

In certain embodiments of these methods, the frequency of the external clock signal may be measured by generating a first clock signal from a reference clock signal, and then comparing a frequency of the first clock signal to the frequency of the external clock signal. The frequency of the first clock signal is then adjusted based on the results of the comparison, and the frequency of the external clock signal is determined based on the adjustments made to the frequency of the first clock signal. In such methods, the comparison of the frequency of the first clock signal to the frequency of the external clock signal and the adjustment of the frequency of the first clock signal based on the results of the comparison may be performed repeatedly until the frequency of the first clock signal is approximately equal to the frequency of the external clock signal.

In other embodiments of these methods, the frequency of the external clock signal may be measured by generating a plurality of second clock signals from a reference clock signal, and then comparing the frequency of each of the plurality of second clock signals to the frequency of the external clock signal. The frequency of the external clock signal may then be determined based on the comparisons of the frequencies of each of the plurality of second clock signals to the frequency of the external clock signal. For example, the frequency of the external clock signal may be determined to be equal to or between the frequencies of the two consecutive of the plurality of second clock signals that yielded different comparison results. In such methods, the plurality of second clock signals may be generated from the reference clock signal by, for example, generating each of the plurality of second clock signals as a pulsed clock signal that is derived from a respective one of the bits of a value stored in the semiconductor memory device.

In still further embodiments of these methods, the frequency of the external clock signal may be measured by estimating a range of the frequency of the external clock signal based on a plurality of comparisons of the frequency of the external clock signal to a plurality of second clock signals, and then determining the frequency of the external clock signal within the estimated range. This may be accomplished, for example, by generating a plurality of second clock signals from a reference clock signal, and then comparing a frequency of each of the plurality of second clock signals to the frequency of the external clock signal. The frequency of the external clock signal may be estimated based on the results of these comparisons. A first clock signal is then generated from the reference clock signal, where the initial frequency of the first clock signal is set based on the estimate of the frequency of the external clock signal. The initial frequency of the first clock signal is then compared to the frequency of the external clock signal, and the frequency of the first clock signal is adjusted based on the results of this comparison. Finally, the frequency of the external clock signal may be determined based on the adjustments made to the frequency of the first clock signal.

In the above-described methods, the CAS latency value may be automatically set by pre-selecting the CAS latency value that is to be used for each of a plurality of ranges of frequencies of the external clock signal and then automatically setting the CAS latency value to the pre-selected CAS latency value that corresponds to the measured frequency of the external clock signal.

Pursuant to further embodiments of the present invention, methods of measuring a frequency of an external clock signal are provided in which an internal clock signal is generated from a reference clock signal. A frequency of the internal clock signal is compared to the frequency of the external clock signal. The frequency of the internal clock signal is then adjusted based on the result of the comparison, and the frequency of the external clock signal is determined based at least in part on the adjustment made to the frequency of the internal clock signal.

In these methods, the comparison of the frequency of the internal clock signal to the frequency of the external clock signal and the adjustment of the frequency of the internal clock signal based on the results of the comparison may be performed repeatedly until, for example, the frequency of the internal clock signal is approximately equal to the frequency of the external clock signal. The internal clock signal may comprise a pulse signal. The frequency of the internal clock signal may be set and/or adjusted to be a multiple of the frequency of the reference clock signal.

These methods may also include generating a plurality of second internal clock signals from a reference clock signal, and then obtaining an estimate of the frequency of the external clock signal by comparing a frequency of each of the plurality of second internal clock signals to the frequency of the external clock signal. In such methods, the initial frequency value of the internal clock signal may be based on the obtained estimate of the frequency of the external clock signal.

In still further embodiments of the present invention, methods of measuring a frequency of an external clock signal are provided in which a plurality of internal clock signals are generated from a reference clock signal. A frequency of each of the plurality of internal clock signals is compared to the frequency of the external clock signal, and the frequency of the external clock signal is determined based on the comparisons of the frequencies of each of the plurality of internal clock signals to the frequency of the external clock signal.

In these methods, the frequency of the external clock signal may be determined to be equal to or between the frequencies of the two consecutive of the plurality of internal clock signals that yielded different comparison results. Each of the plurality of internal clock signals may be generated as a pulsed clock signal that is derived from a respective one of the bits of a value stored in the semiconductor memory device.

Pursuant to still further embodiments of the present invention, circuits for measuring the frequency of an external clock signal are provided that include a pulse generation unit that is configured to generate a pulse clock signal from a reference clock signal and a comparator that is configured to generate a control signal based on a comparison of a frequency of the pulse clock signal and a frequency of the external clock signal. In these circuits, the pulse generation unit receives the control signal from the comparator, and is configured to adjust the frequency of the pulse clock signal based on the control signal. The pulse generation unit outputs information about the frequency of the external clock signal.

These circuits may also include a setting unit that is configured to provide a first code that is used in setting an initial value of the frequency of the pulse clock signal. The circuit may also include a reference clock generation unit that provides the reference clock signal to the pulse generation unit. The pulse clock signal may have a frequency that is a multiple of the frequency of the reference clock signal.

In certain embodiments of these circuits, the pulse generating unit may be implemented as a first accumulator that is configured to output a code in response to the control signal and a second accumulator that is configured to output the pulse clock signal, where the output pulse clock signal has a frequency which corresponds to the code output from the first accumulator. In such embodiments, the first accumulator may include a first register that outputs the code, a control code generation unit that is configured to output a control code in response to the control signal and an adder that is configured to sum the code output from the first register and the control code in response to the reference clock signal, and that is further configured to provide the resulting sum to the first register. Likewise, the second accumulator may be implemented as, for example, a second register that has an output signal which is used to form the pulse clock signal and an adder that is configured to sum the output of the second register and the code output from the first register in response to the reference clock signal, and that is further configured to provide the resulting sum to the second register.

In yet further embodiments of the present invention, circuits for measuring the frequency of an external clock signal are provided which include a reference clock generation unit that is configured to output a reference clock signal that has a reference frequency, an accumulator operating in response to the reference clock signal that is configured to output a plurality of pulse signals, where each of the plurality of pulse signals has a frequency that is a respective one of a plurality of predetermined multiples of the reference frequency. These circuits also include a plurality of comparison units that are each configured to compare a respective one of the frequencies of the plurality of pulse signals with the frequency of the external clock signal and to output a signal indicating the result of the comparison. In these circuits, the output signal from one or more of the plurality of comparison units may provide an estimate of the frequency of the external clock signal.

These circuits may also include a setting unit that is configured to provide a first code that is used to determine the frequencies of the plurality of pulse signals. In certain embodiments of these circuits, the accumulator can be implemented, for example, as a register having an output which is used to form the plurality of pulse signals and an adder that is configured to sum the output of the register and the first code in response to the reference clock signal and provide the resulting sum to the register.

According to still further embodiments of the present invention, circuits for measuring the frequency of an external clock signal are provided that include a reference clock generation unit that is configured to output a reference clock signal that has a predetermined frequency, a first frequency measuring circuit that is configured to identify a range of the frequency of the external clock signal and a second frequency measuring circuit that is configured to more accurately determine the frequency of the external clock signal within the identified frequency range.

In exemplary embodiments of these circuits, the first frequency measuring circuit may be implemented as a first accumulator that is configured to output a plurality of pulse signals, a setting unit that is configured to provide a first code that is used to determine the frequencies of the plurality of pulse signals and a plurality of comparison units that are each configured to compare a respective one of the frequencies of the plurality of pulse signals with the frequency of the external clock signal and to output a signal indicating the results of the comparison. The second frequency measuring circuit may be implemented, for example, as a pulse generation unit that is configured to generate a second pulse signal having a frequency that is a multiple of the frequency of the reference clock signal, a second setting unit that sets an initial value of a second code that is used to set the initial frequency of the second pulse signal, where the second code is set based on the output signals from the plurality of comparison units, and a comparator that is configured to generate a control signal based on a comparison of a frequency of the second pulse signal and the frequency of the external clock signal. The pulse generation unit may receive the control signal from the comparator and may be configured to adjust the frequency of the second pulse signal based on the control signal, and may output information about the frequency of the external clock signal.

In exemplary embodiments of circuits according to the present invention, the reference clock generator unit may be implemented as a bias voltage generation unit that includes a bandgap bias circuit that generates a bias voltage, a bias current generation unit that is configured to output a bias current in response to the bias voltage and an oscillation unit that is configured to output the reference clock signal with a frequency that is set based on the bias current. The oscillation unit may be, for example, a ring oscillator that includes a plurality of inverters connected to each other in series. The bias current generation unit may be configured to change the magnitude of the bias current in response to a bias code that is received from the setting unit.

Each of the frequency measuring circuits described above may be implemented in a semiconductor memory device. In such embodiments, the setting unit may be implemented, for example, in a mode setting register of the semiconductor memory device.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. It will also be understood that when a step or act is referred to as being performed "based on" some output, element or the like, it can be based either partly or entirely on the identified output or element. If a step or act is referred to as being "based only on" some output, element, or the like, then it will be understood that the step or act is based solely and entirely on the identified output, element, or the like.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, frequency measuring circuits according to embodiments of the present invention and semiconductor memory devices that include these frequency measuring circuits are described with reference to the accompanying drawings.

Figure 3:
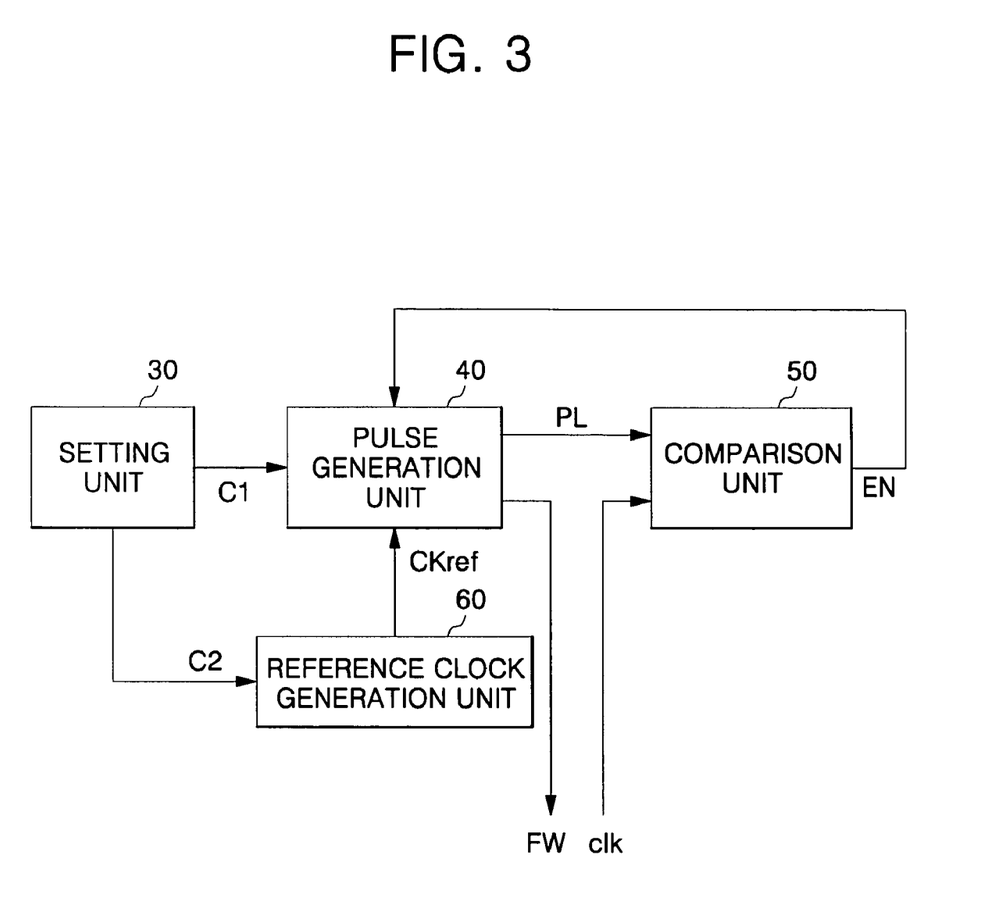
FIG. 3 is a block diagram of a frequency measuring circuit according to first embodiments of the present invention.

FIG. 3 is a block diagram of a frequency measuring circuit according to first embodiments of the present invention. As shown in FIG. 3, the frequency measuring circuit includes a setting unit 30, a pulse generation unit 40, a comparison unit 50, and a reference clock generation unit 60.

As shown in FIG. 3, the setting unit 30 may output a first code C1. This code C1 may be used to set the frequency of the pulse PL that is initially output from the pulse generation unit 40. The setting unit 30 may also output a second code C2. The code C2 may be used to set the frequency of a reference clock signal CKref that is output from the reference clock generation unit 60. When the frequency measuring circuit illustrated in FIG. 3 is used in a semiconductor memory device, the setting unit 30 can be implemented, for example, as a mode setting register or the like. For example, the setting unit 30 might be implemented by configuring the mode setting register to input a signal applied to an address pin in response to a mode control signal and to output the first code C1 and/or the second code C2 in response to that input signal.

The pulse generation unit 40 may comprise, for example, an accumulator or the like. As shown in FIG. 3, the pulse generation unit 40 outputs a pulse signal PL. The pulse signal PL may have a frequency that is a predetermined multiple of the frequency of the reference clock signal CKref output from the reference clock generation unit 60. The predetermined multiple may be an integer multiple (e.g., 1, 2, etc.) or a fractional multiple (e.g., ½, ¼, etc.). The pulse generation unit 40 also outputs a signal containing information about the frequency of the external clock signal clk that is input to the circuit of FIG. 3. The signal may comprise, for example, a digital value FW that corresponds to the frequency of the external clock signal clk. As noted above, the frequency of the pulse signal PL that is initially output from the pulse generation unit 40 may be set by the first code C1, and the subsequent frequency of the pulse signal PL may gradually increase (or decrease, depending upon the particular implementation) in response to the control signal EN that is output from the comparison unit 50.

The comparison unit 50 may be used to compare the frequency of the pulse signal PL that is input from the pulse generation unit 40 with the frequency of the externally input clock signal clk. The comparison unit 50 outputs a control signal EN in response to the result of this comparison. By way of example, the comparison unit 50 can determine which of the pulse signal PL and the clock signal clk has a higher frequency by counting each signal for a predetermined time. It will be appreciated that other methods of making this comparison may also be used.

The reference clock generation unit 60 outputs the reference clock signal Ckref. The reference clock signal Ckref may have a predetermined frequency. As noted above, the frequency of the reference clock signal CKref may be adjusted by the second code C2 output from the setting unit 30.

The components illustrated in FIG. 3 may operate as follows in certain embodiments of the present invention.

The reference clock generation unit 60 outputs a reference clock signal CKref that has a frequency corresponding to the second code C2 that is provided from the setting unit 30. The pulse generation unit 40 operates in response to the reference clock signal CKref, and outputs a pulse signal PL that has a frequency that is a predetermined multiple of the frequency of the reference clock signal CKref. The frequency of the pulse signal initially output from the pulse generation unit 40 may be determined by the first code C1 from the setting unit 30.

The comparison unit 50 compares the pulse signal PL with the frequency of the external clock signal clk and outputs a control signal EN in response to the result of this comparison. In an exemplary embodiment of the present invention, the comparison unit 50 activates the control signal EN to a high level when the frequency of the pulse signal PL is lower than the frequency of the external clock signal clk.

The pulse generation unit 40 changes the frequency of the pulse signal PL in response to the control signal EN. In certain embodiments of the present invention, when the control signal EN is activated, the pulse generation unit gradually increases the frequency of the pulse signal PL. Subsequently, the comparison unit 50 again compares the frequency of the external clock signal clk with the frequency of the pulse signal PL, and outputs the control signal EN in response to the result of the comparison. This procedure is repeated until the frequency of the pulse signal PL becomes approximately equal to the frequency of the external clock signal clk.

As is also shown in FIG. 3, the pulse generation unit 40 may output a signal FW which may, for example, comprise a digital value, that corresponds to the frequency of the pulse signal PL. The signal FW may be output, for example, after a predetermined time has lapsed or after it is determined that the frequency of external clock signal and the frequency of the pulse signal are approximately equal. When the comparison between the external clock signal clk and the frequency of the pulse signal PL (which is gradually increasing) is repeated as described above, it can be seen that the frequency of the pulse signal PL should become approximately equal to the frequency of the external clock signal clk after a period of time has elapsed. Accordingly, the signal FW corresponding to the frequency of the pulse signal PL is output as information about the frequency of the external clock signal clk.

Figure 4:
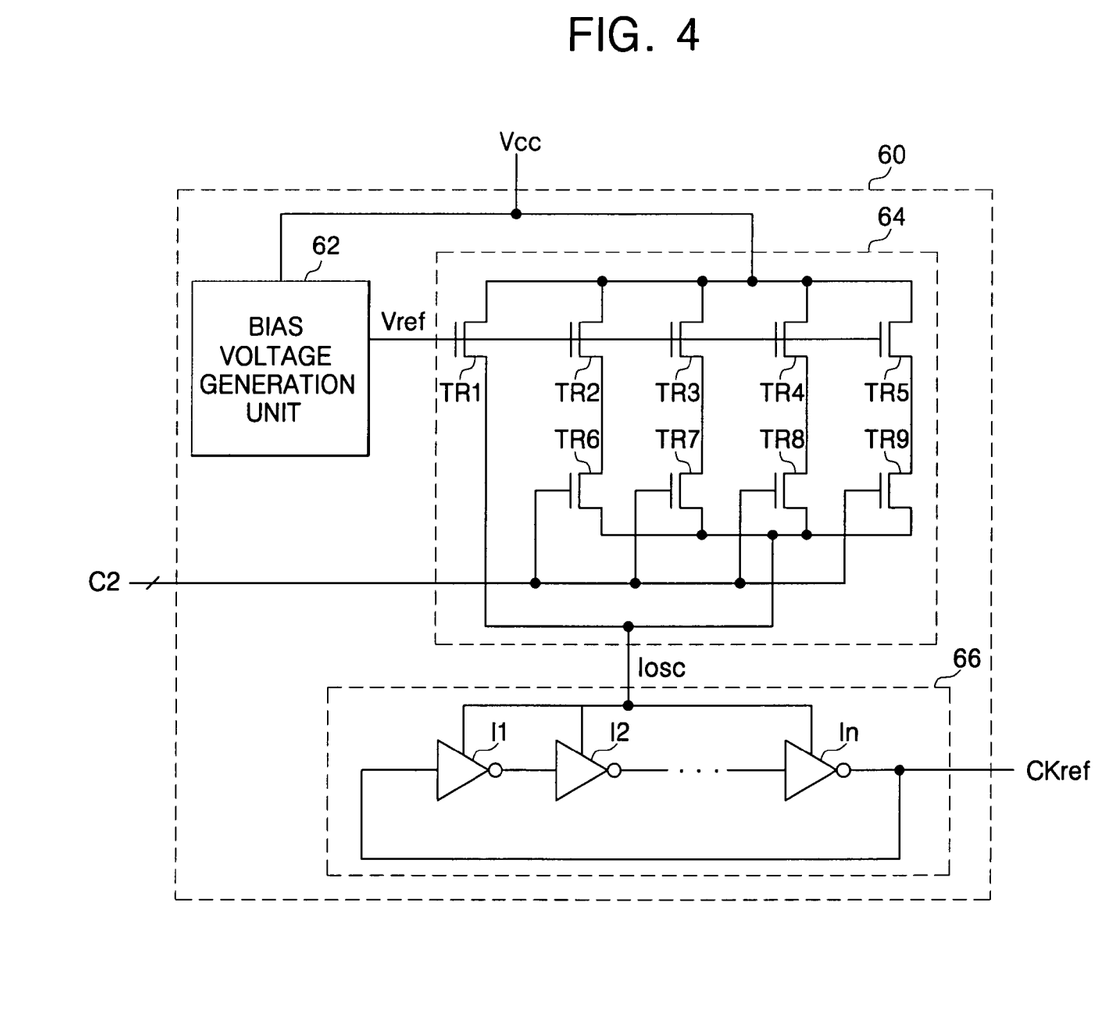
FIG. 4 is a block diagram of a reference clock generation unit according to embodiments of the present invention.

FIG. 4 is a block diagram of a reference clock generation unit 60 according to embodiments of the present invention that may be used, for example as the frequency measuring circuit of FIG. 3. The reference clock generation unit 60 of FIG. 4 includes a bias voltage generation unit 62, a bias current output unit 64 that is composed of nine transistors TR1, TR2, ..., TR9, and an oscillation unit 66 that is composed of a plurality of inverters I1, I2, ..., In.

In the reference clock generation unit 60 of FIG. 4, the bias voltage generation unit 62 outputs a constant bias voltage Vref. The bias voltage generation unit 62 can be designed, for example, using a bandgap circuit, which may be less sensitive to errors which might occur during manufacture of the circuit.

The bias current output unit 64 outputs a bias current Iosc in response to the bias voltage Vref and the second code C2. In particular, the transistors TR1, TR2, ..., TR5 output constant currents in response to the bias voltage Vref. The transistors TR6, ..., TR9 are turned on and off in response to the second code C2, and act to adjust the bias current Iosc. Thus, for example, when the second code C2 is '1111', all of the transistors TR6, ..., TR9 are turned on so that the bias current Iosc becomes maximized. In contrast, when the second code C2 is '0000', all of the transistors TR6, ..., TR9 are turned off so that the bias current Iosc becomes minimized. Accordingly, a bias current Iosc which may be used to generate a reference clock signal CKref of a desired frequency can be output in response to the second code C2.

The oscillation unit 66 may comprise a ring oscillator that includes a plurality of inverters I1, I2, ..., In that are connected in series. The oscillation unit 66 outputs the reference clock signal CKref with a constant frequency that corresponds to the bias current Iosc.

Figure 5:
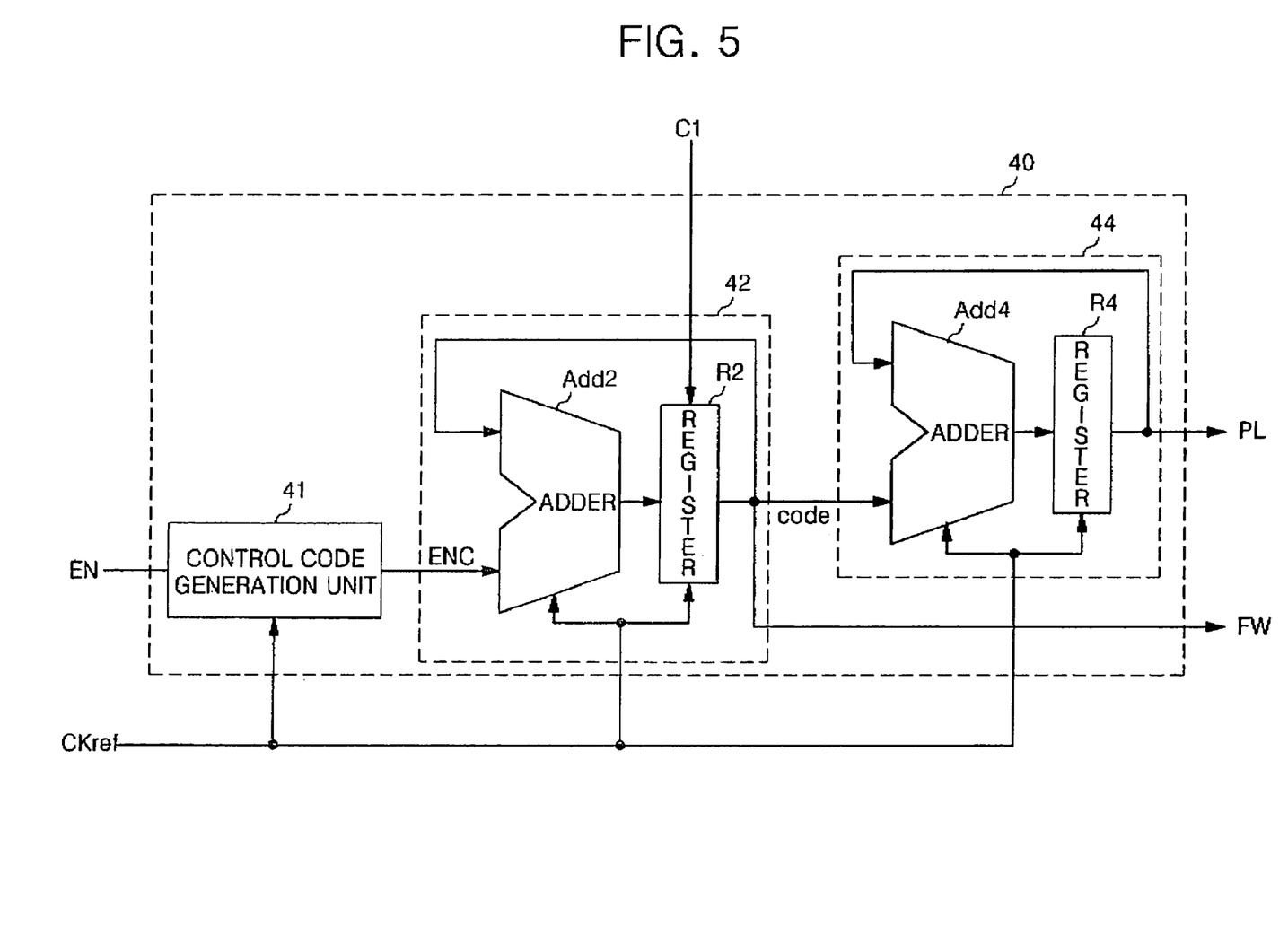
FIG. 5 is a block diagram of a pulse generation unit according to embodiments of the present invention.

FIG. 5 is a block diagram of an embodiment of a pulse generation unit 40 according to embodiments of the present invention that may be used, for example, in the frequency measuring circuit of FIG. 3. As shown in FIG. 5, the pulse generation unit 40 may include a control code generation unit 41 and first and second accumulators 42 (adder Add2 and register R2) and 44 (adder Add4 and register R4).

In the circuit of FIG. 5, the control code generation unit 41 outputs a control code ENC in response to the control signal EN that is output from the comparison unit 50. For example, in an exemplary embodiment of control code generation unit 41, a digital value of '1' is output for one clock period and digital values of '0' for the remaining clock periods when the control signal EN is activated to a high level.

The first accumulator 42 operates in response to the reference clock signal CKref, and outputs a value "code" that is input to the second accumulator in response to the control code ENC output from the control code generation unit 41. The value "code" also serves as a signal FW (here a digital value) that is output from the first accumulator 42. As discussed above, once the feedback process is complete, the signal FW corresponds to the frequency of the external clock signal. As shown in FIG. 5, the initial value of the "code" may be set by the first code C1 that is output from the setting unit 30 to the register R2. This "code" value is fed back from the register R2 to an input terminal of the adder Add2. The control code ENC is input to the other input terminal of the adder Add2. The adder Add2 adds the control code ENC and the value stored in the register R2 on each clock cycle of the reference clock signal CKref, storing the sum of these add operations in the register R2. Accordingly, in this particular embodiment, the "code" value stored in register R2 may increment by one whenever the control signal EN input from the comparison unit 50 is activated to a high level.

As is also shown in FIG. 5, the second accumulator 44 outputs the pulse signal PL in response to the "code" that is output from register R2. The frequency of the pulse signal PL may correspond to the code. This is accomplished in the particular implementation of FIG. 5 by feeding back the output signal of the register R4 to one of the input terminals of the adder Add4, and inputting the "code" value from register R2 to the other input terminal of adder Add4. The adder Add4 adds the "code" value with the value stored in the register R4 on each clock cycle of the reference clock signal Ckref and stores the resulting sum in the register R4. In addition, the circuit outputs the most significant bit (MSB) of the values stored in the register R4 as the pulse signal PL. In this manner, the frequency of the pulse signal PL increases when the code is high and decreases when the code is low.

Figure 6:
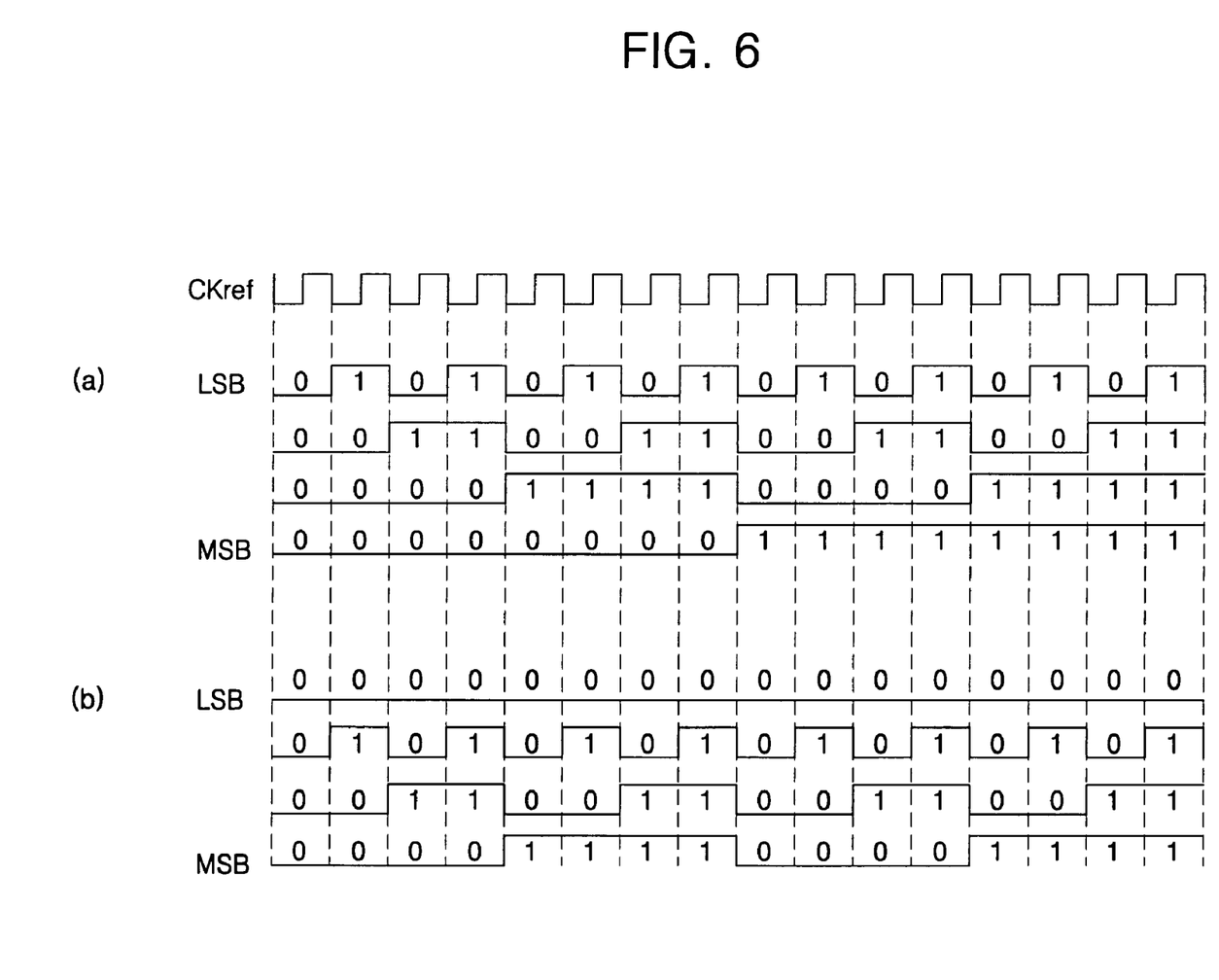
FIG. 6 is an operational timing diagram that illustrates a change of the frequency of a pulse signal in response to a code in the pulse generation unit shown in FIG. 5.

FIG. 6 is an operational timing diagram that illustrates how, in certain embodiments of the present invention, the frequency of the pulse signal PL may change in response to the "code" value in the pulse generation unit 40 of FIG. 5. In the exemplary timing diagram of FIG. 6, the first and second accumulators each have four bits. The top timing chart in FIG. 6 (labeled "(a)") corresponds to a code value of '1', and the bottom timing chart of FIG. 6 (labeled "(b)") corresponds to a code value of '2'.

As shown in the upper timing chart (a) of FIG. 6, the second accumulator 44 adds the code '1' with the value of the register R4 on each clock cycle of the reference clock signal CKref. As shown in the timing diagram, the value stored in register R4 increments by '1' on each clock cycle of the reference clock signal Ckref ('0000', '0001', '0010', ... ). As a result, the frequency of the pulse signal PL, which is the MSB of the second accumulator 44, becomes one sixteenth of the frequency of the reference clock signal CKref.

In the example illustrated in the timing chart at the bottom of FIG. 6 (example "(b)"), the second accumulator 44 adds the value of the register R2, '2', with the value of the register R4 on each clock cycle of the reference clock signal CKref. As a result, the value of the register R4 increments by '2' on each clock cycle of the reference clock signal CKref ('0000', '0010', '0100', ... ) so that the frequency of the pulse signal PL, which is the MSB of the second accumulator 44, becomes one eighth of the frequency of the reference clock signal CKref. Thus, in this particular embodiment, the frequency of the pulse signal PL increases when the code increases.

Thus, in this particular embodiment of the present invention, the frequency measuring circuit of FIGS. 3 and 5 outputs a first code C1 that is used to set an initial value of a code in the pulse generation unit 40. The second accumulator 44 of the pulse generation unit 40 outputs a pulse signal PL that has a frequency that corresponds to the code. The comparison unit 50 compares the pulse signal PL with the frequency of an external clock signal clk, and activates the control signal EN to a high level when the frequency of the pulse signal PL is lower than the frequency of the external clock signal clk.

When the control signal EN becomes activated to a high level, the first accumulator 42 of the pulse generation unit 40 increments the code by one. As a result, the pulse signal PL output by the second accumulator 44 has a frequency that corresponds to a code which has been incremented by one. The comparison unit 50 compares the pulse signal PL with the frequency of the external clock signal clk again. As this procedure is repeated, the frequency of the pulse signal PL may become approximately equal to the frequency of the external clock signal clk. Accordingly, after a predetermined time has lapsed (or some other criteria), the code stored in the register R2 of the first accumulator 42 of the pulse generation unit 40 may be output as a signal FW that corresponds to the frequency of the external clock signal clk.

The frequency measuring circuit of FIG. 3 may measure the external clock signal clk with high resolution.

Figure 7:
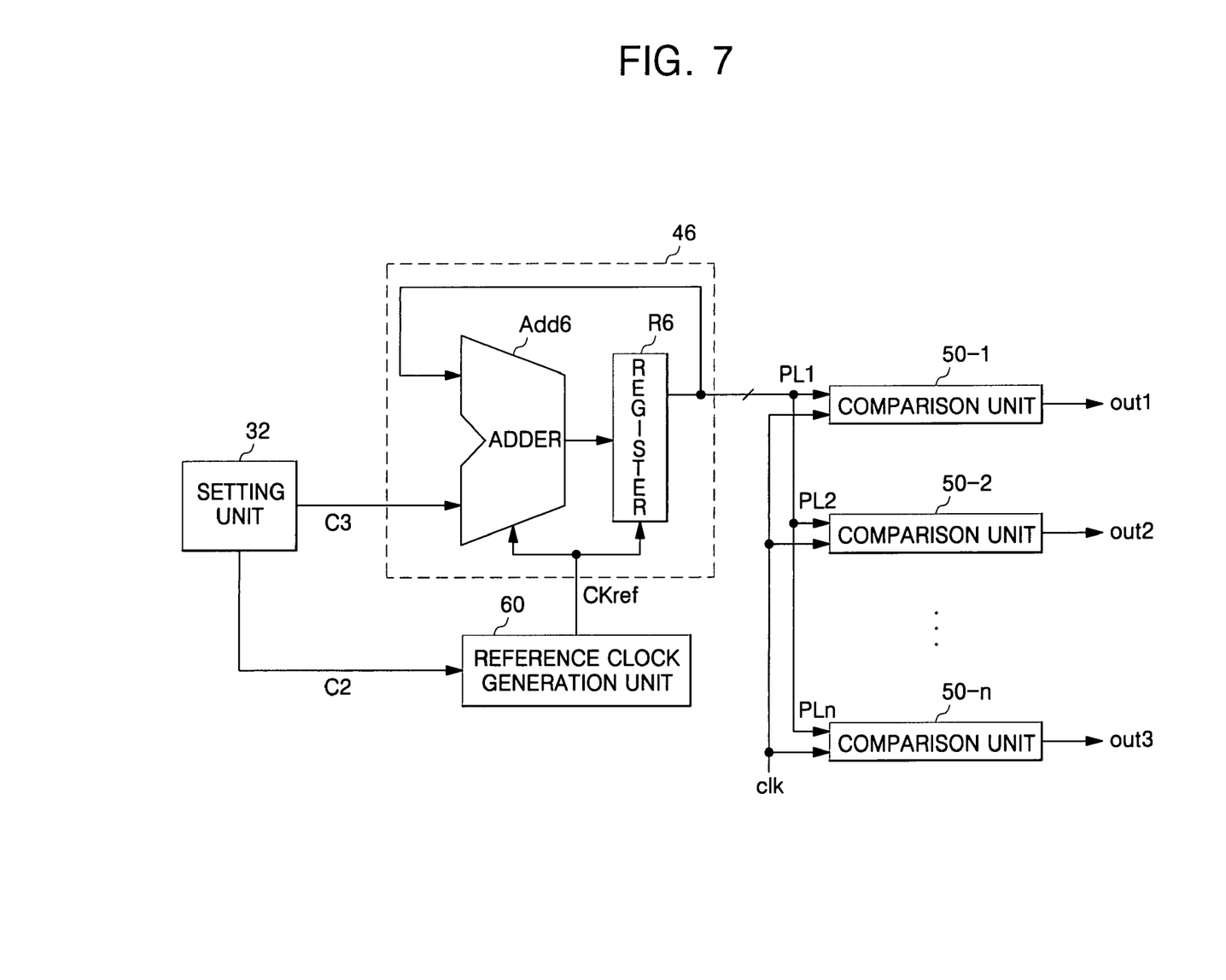
FIG. 7 is a block diagram of a frequency measuring circuit according to second embodiments of the present invention.

FIG. 7 is a block diagram of a frequency measuring circuit according to second embodiments of the present invention. The frequency measuring circuit of FIG. 7 may provide for relatively quick synchronization of an internal clock signal to an external clock signal. The frequency measuring circuit of FIG. 7 includes a setting unit 32, an accumulator 46 that comprises an adder Add6 and a register R6, a plurality of comparison units 50-1, 50-2, . . . , 50-n, and a reference clock generation unit 60. The reference clock generation unit 60 may operate in the same manner as does the reference clock generation unit of the frequency measuring circuit of FIG. 3.

The setting unit 32 in the frequency measuring circuit of FIG. 7 outputs a third code C3 which may be used in setting the frequency of a plurality of pulse signals PL1, PL2, . . . , PLn that are output from the accumulator 46. The setting unit 32 may also output a second code C2 that may be used to adjust the frequency of the reference clock signal CKref that is output from the reference clock generation unit 60. The setting unit 32 may be, implemented, for example, in the mode setting register of a semiconductor device. In particular, the mode setting register may be configured to input a signal applied to an address pin in response to a mode control signal and to output the third code C3 and the second code C2.

As shown in FIG. 7, the accumulator 46 outputs a plurality of pulse signals PL1, PL2, . . . , PLn in response to the third code C3. The pulse signals PL1, PL2, . . . , PLn may have different frequencies. The pulse signals PL1, PL2, . . . , PLn may be generated by applying the signal output from the register R6 to one input terminal of the adder Add6, while applying the third code C3 to the other input terminal. The adder Add6 adds the third code C3 and the value stored in the register R6 and stores the resulting sum in the register R6 on each clock cycle of the reference clock signal CKref. The register R6 outputs the 'n' least significant bits (LSB) of the value stored in register R6 as the pulse signals PL1, PL2, . . . , PLn, respectively. Accordingly, the accumulator 46 can be used to output a plurality of pulse signals PL1, PL2, . . . , PLn each of which have a different frequency that is related to (or "corresponds" to) the third code C3.

Each of the plurality of comparison units 50-1, 50-2, . . . , 50-n compare a respective one of the pulse signals PL1, PL2, . . . , PLn with the frequency of the external clock signal clk, and outputs comparison signals out1, out2, . . . , outn in response to the respective results of these comparisons. For example, these comparisons may be accomplished by having the plurality of comparison units 50-1, 50-2, . . . , 50-n count the external clock signal clk and the pulse signals PL1, PL2, . . . , PLn, respectively, for a predetermined time, and then compare the frequencies of the signals based on these counts.

Accordingly, the comparison signals out1, out2, . . . , outn provide information about the frequency of the clock signal clk in a thermometer code format. Although not shown, the frequency measuring circuit illustrated in FIG. 7 can further include an encoder which converts the comparison signal into a digital value corresponding to the frequency of the external clock signal clk in response to the comparison signals out1, out2, . . . , outn.

The embodiment of the frequency measuring circuit illustrated in FIG. 7 may operate as follows.

The reference clock generation unit 60 outputs the reference clock signal Ckref, which has a frequency that corresponds to the second code C2 that is input to the reference clock generation circuit 60 from the setting unit 32. The accumulator 46 operates in response to the reference clock signal Ckref to output a plurality of pulse signals PL1, PL2, . . . , PLn, each of which has a frequency that corresponds to the third code C3 that is set by the setting unit 32. Each of the comparison units 50-1, 50-2, . . . , 50-n compare a respective one of the pulse signals PL1, PL2, . . . , PLn that are output from the accumulator 46 with the external clock signal clk and output a respective comparison signal out1, out2, . . . , outn that reflects the results of the comparison. The comparison signals out1, out2, . . . , outn may be used as information about the frequency of the clock signal clk as it is, or may be used as digital values about the frequency of the clock signal clk which are converted by the inverter as described above.

Figure 8:
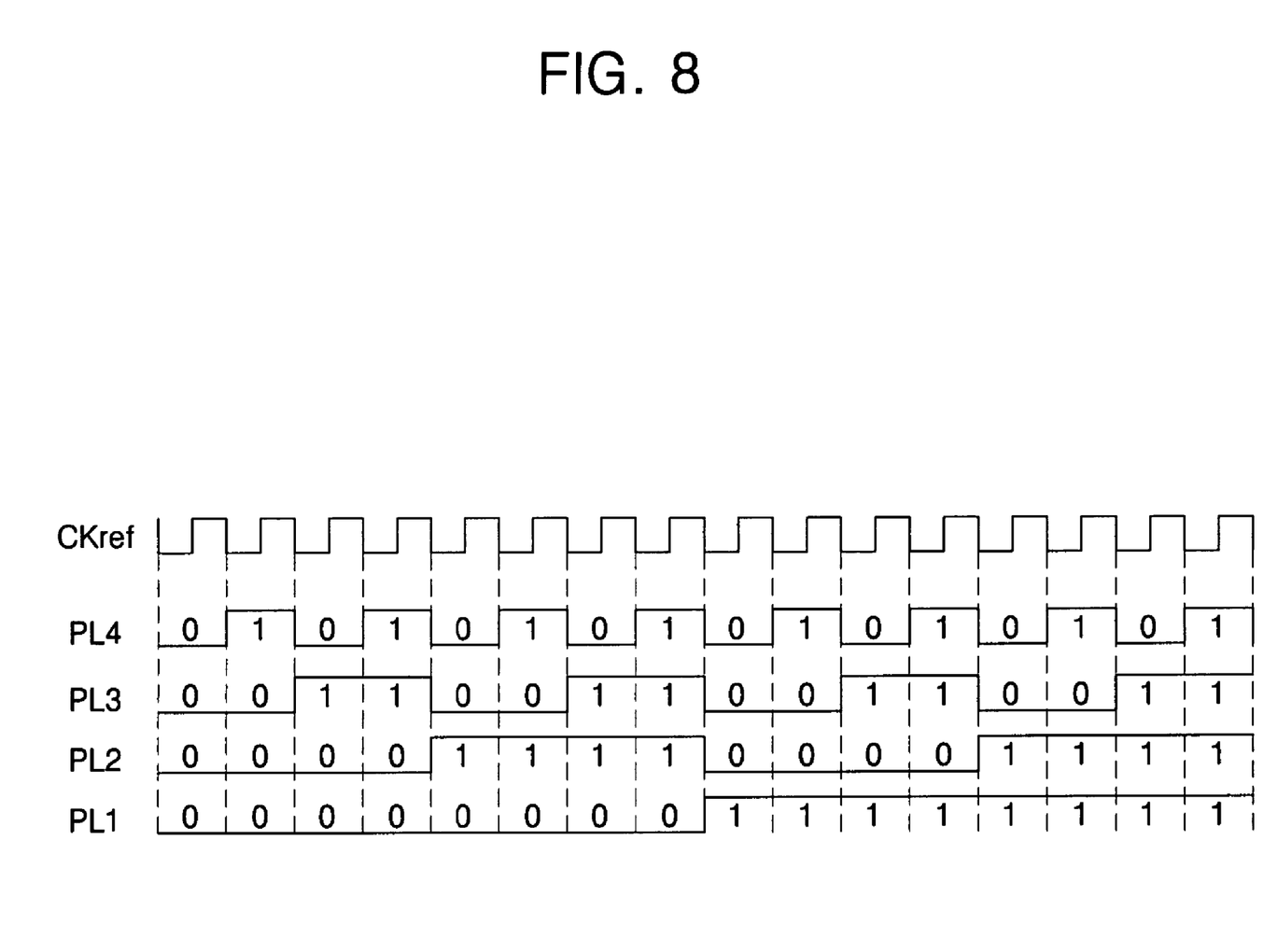
FIG. 8 is an operational timing diagram illustrating operation of an accumulator of the frequency measuring circuit shown in FIG. 7.

FIG. 8 is an operational timing diagram that illustrates operation of the plurality of comparison units 50-1, 50-2, . . . , 50-n and the accumulator 46 of the frequency measuring circuit shown in FIG. 7. In the example timing diagram of FIG. 8, the accumulator 46 has four bits and the third code C3 is set to the value '1'.

Operation of the plurality of comparison units 50-1, 50-2, . . . , 50-n and the accumulator 46 illustrated in FIG. 7 will now be explained with reference to FIG. 8.

As described above, the accumulator 46 adds the value of the register R6 with the third code C3 (which has a value of '1' in this example) on each clock cycle of the reference clock signal CKref, and outputs the sum. Accordingly, the value stored in the register R6 increments by one each clock cycle ('0000', '0001', '0010', . . . ). As a result, the pulse signals PL1, PL2, . . . , PL4 have frequencies that are one sixteenth, one eighth, one fourth, and one half of the frequency of the reference clock signal CKref, respectively.

Accordingly, as described above, when the accumulator 46 has four bits, up to four comparison units 50-1, 50-2, 50-3 and 50-4 may be provided. The pulse signals PL1, PL2, PL3 and PL4 and the external clock signal clk are input to the respective comparison units 50-1, 50-2, 50-3 and 50-4. When the frequency of the external clock signal clk is, for example, slightly higher than one eighth of the frequency of the reference clock signal CKref, the comparison units 50-1 and 50-2 (which receive pulse signals PL1 and PL2 that have a lower frequency than the external clock signal clk) can be configured to output comparison signals out3 and out4 at a high level. Likewise, the comparison units 50-3 and 50-4

(which receive pulse signals PL3 and PL4 that have a higher frequency than the external clock signal clk) can be configured to output comparison signals out3 and out4 at a low level. By means of the above-described structure, the comparison signals out1, out2, out3 and out4 provide information about the frequency of the externally input clock signal clk in a thermometer code format.

While the frequency measuring circuit illustrated in FIG. 7 may be able to more quickly synchronize the frequency as compared to the frequency measuring circuit of FIG. 3, the resolution of the frequency measuring circuit of FIG. 7 may not be as high. That is, in the circuit illustrated in FIG. 3, the frequency of the pulse signal PL is determined by the code, so that the frequency measuring circuit has a resolution of $\frac{1}{2}^{N-1}$ when the second accumulator 44 of the pulse generation unit 40 is an N bit accumulator. However, in the structure illustrated in FIG. 7, N pulse signals PL may be output, so that the frequency measuring circuit has a resolution of 1/N, and when the reference clock generation unit 60 has the structure illustrated in FIG. 4, the frequency of the reference clock signal CKref can be changed by the second code C2 so that it has a resolution of 1/16N.

Figure 9:
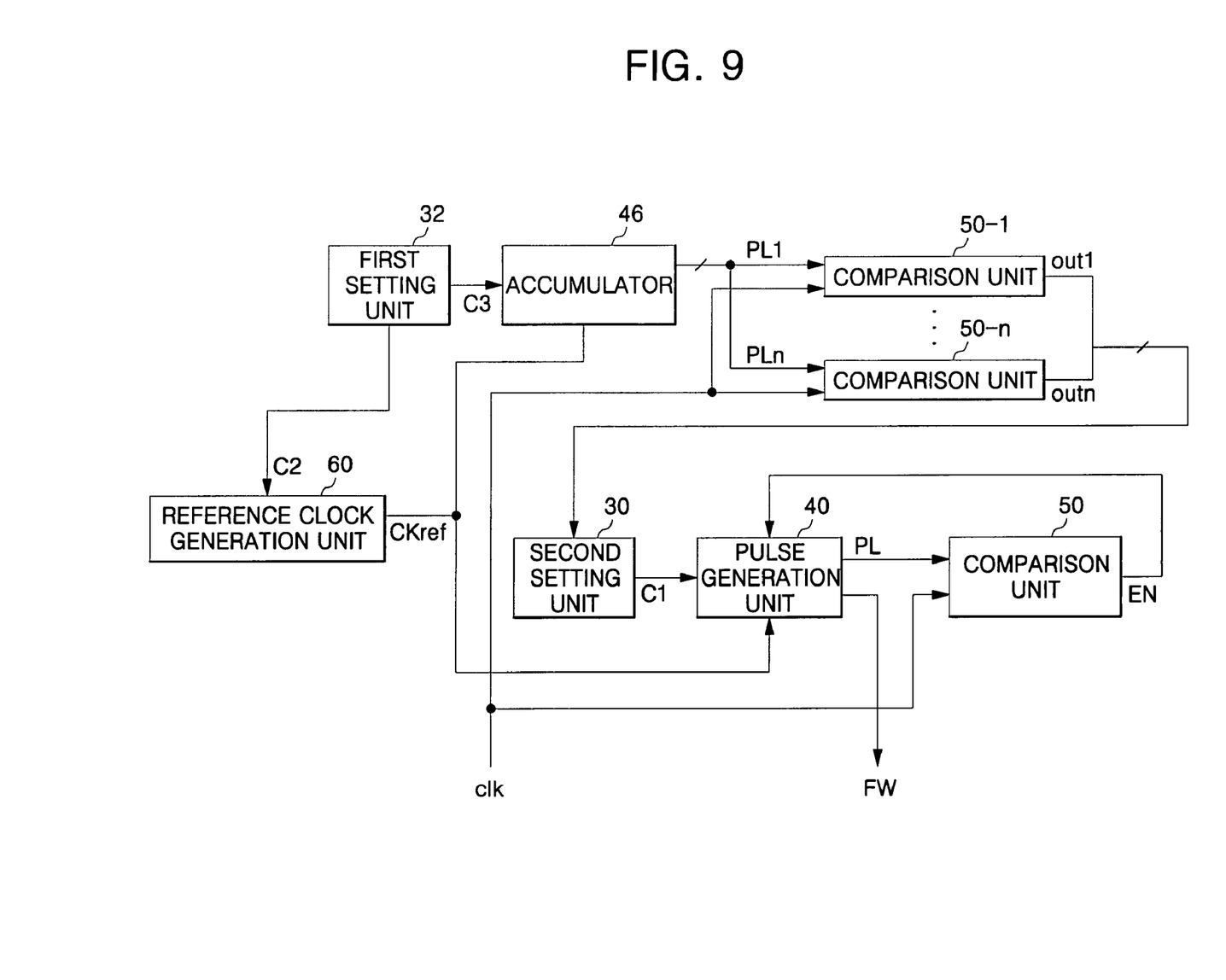
FIG. 9 is a block diagram of a frequency measuring circuit according to third embodiments of the present invention.

FIG. 9 is a block diagram of a frequency measuring circuit according to third embodiments of the present invention. The frequency measuring circuit illustrated in FIG. 9 includes a first setting unit 32, an accumulator 46, a plurality of first comparison units 50-1, 50-2, ..., 50-*n*, a second setting unit 30, a pulse generation unit 40, a second comparison unit 50, and a reference clock generation unit 60. The pulse generation unit 40 may have the same structure as the pulse generation circuit of the frequency measuring circuit of FIG. 5. Additionally, the accumulator 46, the plurality of first comparison units 50-1, 50-2, ..., 50-n, the pulse generation unit 40, the second comparison unit 50, and the reference clock generation unit 60 may operate as the like named elements depicted in FIGS. 3 and/or 7.

As shown in FIG. 9, the first setting unit 32 outputs a third code C3 which is used to set the frequency of the first pulse signals PL1, PL2, ..., PLn that are output from the accumulator 46. The first setting unit further outputs a second code C2 that is used to set the frequency of the reference clock signal CKref that is output from the reference clock generation unit 60. The second setting unit 30 outputs a first code C1 that is used to set the initial frequency of a second pulse signal PL which is output from the pulse generation unit 40 in response to the comparison signals out1, out2, ..., outn input from the first comparison units 50-1, 50-2, ..., 50-*n*.

Similar to the embodiments of the present invention discussed above, the first and second setting units 32 and 30 of the frequency measuring circuit of FIG. 9 may be implemented by configuring the mode setting register of a semiconductor device that includes the frequency measuring circuit to output the third code C3, the second code C2, and/or the first code C1 in response to an input signal applied to an address pin and a mode control signal.

The frequency measuring circuit of FIG. 9 may operate as follows.

The reference clock generation unit 60 outputs a reference clock signal CKref that has a frequency which corresponds to the second code C2 that is input from the first setting unit 32. In response to the reference clock signal CKref, the accumulator 46 outputs a plurality of pulse signals PL1, PL2, ..., PLn that have respective frequencies that correspond in some manner to the third code C3 set by the first setting unit 32. The plurality of first comparison units 50-1, 50-2, ..., 50-*n* compare respective of the first pulse signals PL1, PL2, ..., PLn input from the accumulator 46 with the external clock signal clk, and output comparison signals out1, out2, ..., outn that reflect the results of these respective comparisons.

The second setting unit 30 outputs a first code C1 in response to the comparison signals out1, out2, ..., outn. The first code C1 is used to set the frequency of the pulse signal PL which is output from the pulse generation unit 40. The pulse generation unit 40 operates in response to the reference clock signal CKref, and outputs the second pulse signal PL. The second comparison unit 50 compares the pulse signal PL with the frequency of the external clock signal clk, and outputs a control signal EN having a value that is set based on the result of the comparison. In the particular embodiment of FIG. 9, when the frequency of the pulse signal PL is lower than the frequency of the clock signal clk, the control signal EN is activated to a high level.

The pulse generation unit 40 changes the frequency of the pulse signal PL in response to the control signal EN. Specifically, when the control signal EN is activated, the pulse generation unit 40 gradually increases the frequency of the pulse signal PL. The second comparison unit 50 then compares the pulse signal PL with the clock signal clk again, and outputs the control signal EN in response to the comparison result. As this procedure is repeated over a period of time, the frequency of the pulse signal PL may become approximately equal to the frequency of the external clock signal clk. Accordingly, after a period of time has lapsed (which may be a predetermined period of time), the pulse generation unit 40 may output a digital value FW that corresponds to the frequency of the pulse signal PL as information about the frequency of the external clock signal clk.

Thus, pursuant to the third embodiment of the frequency measuring circuit of the present invention illustrated in FIG. 9, the code setting unit 32, the accumulator 46, and the plurality of first comparison units 50-1, 50-2, ..., 50-*n* may be used to measure an approximate range of the frequency of the clock signal clk and to determine the frequency of the pulse signal PL initially output from the pulse generation unit 40. Then, the frequency of the pulse signal PL may be gradually increased to synchronize it to the frequency of the clock signal clk. Accordingly, the time taken to synchronize to the external clock signal can be shortened without degrading the accuracy of the synchronization.

By way of example, if the accumulator 46 has four bits and the third code C3 is set to '1', the frequencies of the first pulse signals PL1, PL2, PL3 and Pl4 become one sixteenth, one eighth, one fourth, and one half of the frequency of the reference clock signal CKref, respectively. When the frequency of the external clock signal clk is a little higher than one eighth of the frequency of the reference clock signal CKref, the first comparison units 50-1 and 50-2 output comparison signals out1 and out2 at a high level, and the first comparison units 50-3 and 50-4 output comparison signals out3 and out 4 at a low level.

As described above, when the comparison signals out1, out2, out3 and out4 are output, the frequency of the external clock signal clk is in a range between one eighth and one fourth of the frequency of the reference clock signal CKref. Accordingly, the second setting unit 30 sets the first code C1 to '2', and the pulse generation unit 40 outputs the second pulse signal PL having a frequency (i.e. one eighth of the frequency of the reference clock signal CKref) that corresponds to the value (i.e., 2) of the first code C1. The second comparison unit 50 compares the frequency of the second pulse signal PL with the frequency of the external clock signal clk and outputs the control signal EN, and the pulse generation unit 40 gradually increases the frequency of the second pulse signal PL in response to the control signal EN while measuring the frequency of the clock signal clk.

Figure 10:
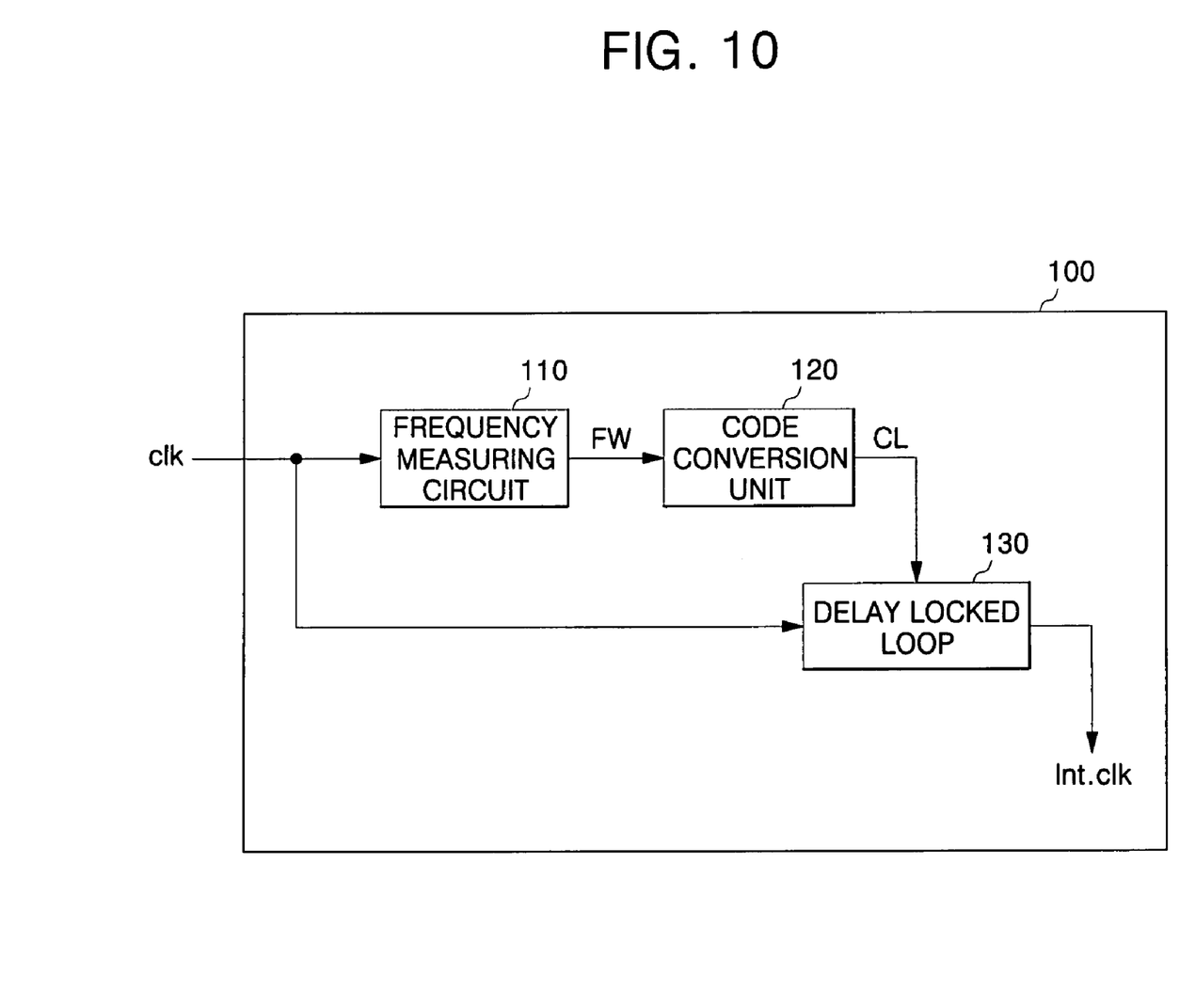
FIG. 10 is a block diagram of a semiconductor memory device that includes a frequency measuring circuit according to embodiments of the present invention.

FIG. 10 is a block diagram of a semiconductor memory device 100 that includes a frequency measuring circuit according to embodiments of the present invention. The semiconductor memory device 100 includes a frequency measuring circuit 110, a code conversion unit 120, and a DLL 130.

The frequency measuring circuit 110 measures the frequency of the external clock signal clk to output a digital value FW containing information about the frequency of the external clock signal clk. The code conversion unit 120 converts the digital value FW to a CAS latency (CL) value. The code conversion unit 120 may be implemented, for example, as multiplexer or as a lookup table. The DLL 130 may have, for example, the same structure as the DLL illustrated in FIG. 2, and outputs an internal clock signal int.clk that is synchronized with the external clock signal clk. The delay time of the internal delay circuit may be set based on the CL value.

As described with reference to FIG. 2, when the DLL is employed in the semiconductor memory device, the internal clock signal can be synchronized with the external clock signal even when the delay circuit having a short delay time is used when the frequency of the input clock signal is high. However, a delay circuit having a relatively long delay time is required when the frequency of the input clock signal is low.

To discriminate between these cases, the CL value is set by the user in conventional semiconductor memory devices. However, the frequency measuring circuits according to embodiments of the present invention allow the CL value to be automatically generated using, for example, a digital value FW output from the frequency measuring circuit 110. Therefore, the user does not have to set the CL value manually.

Therefore, the frequency measuring circuit according to embodiments of the present invention can automatically provide information about the frequency of the input clock signal without input from the user.

In addition, in semiconductor memory devices according to embodiments of the present invention, the user does not need to change the setting information about the frequency of the input clock signal even when the frequency is changed, so that mis-operation which may occur from incorrect setting of the frequency information by the user can be prevented.

Pursuant to embodiments of the present invention, circuits and methods are provided which may be used to "measure" and/or "determine" the frequency of an external clock signal. It will be appreciated in light of the present disclosure that the frequency of the external clock signal need not be "measured" or "determined" with absolute accuracy and that, in fact, certain embodiments of the present invention may only provide a rough measurement of the frequency. Such rough "measurements" are considered to constitute a "measurement" or "determination" of the frequency of the external clock signal.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of measuring a frequency of an external clock signal, the method comprising:
    simultaneously generating a plurality of internal clock signals from a reference clock signal, wherein each of the plurality of internal clock signals has a frequency that is a respective one of a plurality of predetermined multiples of a frequency of the reference clock signal;
    comparing a frequency of each of the plurality of internal clock signals to the frequency of the external clock signal in each of a plurality of comparison units, respectively; and
    determining the frequency of the external clock signal based at least in part on the comparisons of the frequencies of each of the plurality of internal clock signals to the frequency of the external clock signal.

2. The method of claim 1, wherein determining the frequency of the external clock signal based at least in part on the comparisons of the frequencies of each of the plurality of internal clock signals to the frequency of the external clock signal comprises determining the frequency of the external clock signal to be equal to or between the frequencies of the two consecutive of the plurality of internal clock signals that yielded different comparison results.

3. The method of claim 1, wherein generating the plurality of internal clock signals from the reference clock signal comprises generating each of the plurality of internal clock signals as a pulsed clock signal that is derived from a respective one of the bits of a value stored in the semiconductor memory device, wherein the stored value is changed on at least some of the cycles of the reference clock signal.

4. A circuit for measuring the frequency of an external clock signal, comprising:
    a reference clock generation unit that is configured to output a reference clock signal that has a reference frequency;
    a first accumulator operating in response to the reference clock signal that is configured to simultaneously output a plurality of pulse signals, wherein each of the plurality of pulse signals has a frequency that is a respective one of a plurality of predetermined multiples of the reference frequency; and
    a plurality of comparison units that are each configured to compare a respective one of the frequencies of the plurality of pulse signals with the frequency of the external clock signal and to output a signal indicating the result of the comparison;
wherein the output signal from one or more of the plurality of comparison units provides an estimate of the frequency of the external clock signal.

5. The circuit of claim 4, further comprising a setting unit that is configured to provide a first code that is used to determine the frequencies of the plurality of pulse signals.

6. The circuit of claim 5, wherein the first accumulator comprises:
    a first register having an output which is used to form the plurality of pulse signals; and
    a first adder that is configured to sum the output of the first register and the first code in response to the reference clock signal and provide the resulting sum to the first register.

7. The circuit of claim 5, wherein the reference clock generator unit comprises:
    a bias voltage generation unit that includes a bandgap bias circuit that generates a bias voltage;
    a bias current generation unit that is configured to output a bias current in response to the bias voltage; and an oscillation unit that is configured to output the reference clock signal with a frequency that is set based on the bias current.

8. The circuit of claim 7, wherein the oscillation unit is a ring oscillator that includes a plurality of inverters connected to each other in series.

9. The circuit of claim 7, wherein the bias current generation unit is further configured to change the magnitude of the bias current in response to a bias code that is received from the setting unit.

10. The circuit of claim 5, in combination with a semiconductor memory device.

11. The circuit of claim 10, wherein the setting unit is implemented at least in part in a mode setting register of the semiconductor memory device.

12. The circuit of claim 6, further comprising:
a pulse generation unit that is configured to generate a second pulse signal having a frequency that is a multiple of the frequency of the reference clock signal;
a second setting unit that sets an initial value of a second code that is used to set the initial frequency of the second pulse signal, wherein the second code is set based on the output signals from the plurality of comparison units;
a comparator that is configured to generate a control signal based on a comparison of a frequency of the second pulse signal and the frequency of the external clock signal;
wherein the pulse generation unit receives the control signal from the comparator and is configured to adjust the frequency of the second pulse signal based on the control signal; and
wherein the pulse generation unit outputs information about the frequency of the external clock signal.

13. The circuit of claim 12, wherein the pulse generation unit comprises:
a second accumulator that is configured to output the second code in response to the control signal; and
a third accumulator that is configured to output the second pulse signal that has a frequency which corresponds to the second code output from the second accumulator in response to the reference clock signal.

14. The circuit of claim 13, wherein the second accumulator comprises:
a second register that outputs the second code;
a control code generation unit that is configured to output a control code in response to the control signal; and
a second adder that is configured to sum the code output from the second register and the control code in response to the reference clock signal, and is further configured to provide the resulting sum to the second register.

15. The circuit of claim 14, wherein the third accumulator comprises:
a third register having an output signal which is used to form the second pulse signal; and
a third adder that is configured to sum the output of the third register and the code output from the second register in response to the reference clock signal, and that is further configured to provide the resulting sum to the third register.

16. The circuit of claim 15, wherein the reference clock generator unit comprises:
a bias voltage generation unit that includes a bandgap bias circuit that generates a bias voltage;
a bias current generation unit that is configured to output a bias current in response to the bias voltage; and an oscillation unit that is configured to output the reference clock signal with a frequency that is set based on the bias current.

17. The circuit of claim 16, wherein the oscillation unit is a ring oscillator that includes a plurality of inverters connected to each other in series.

18. The circuit of claim 16, wherein the bias current generation unit is further configured to change the magnitude of the bias current in response to a bias code that is received from the setting unit.

19. The circuit of claim 12, in combination with a semiconductor memory device.

20. A method of determining a frequency of an external clock signal, the method comprising:
simultaneously generating a plurality of internal clock signals from a reference clock signal, wherein each of the plurality of internal clock signals has a frequency that is a respective one of a plurality of predetermined multiples of a frequency of the reference clock signal;
comparing each of the plurality of internal clock signals to the external clock signal in each of a plurality of comparison units, respectively, to determine whether the external clock signal or each respective one of the plurality of internal clock signals has a higher frequency; and
determining an approximate value of the frequency of the external clock signal based at least in part on the comparisons of each of the plurality of internal clock signals to the external clock signal.

21. The method of claim 20, wherein determining an approximate value of the frequency of the external clock signal based at least in part on the comparisons of each of the plurality of internal clock signals to the external clock signal comprises determining the frequency of the external clock signal to be equal to or between the frequencies of the two consecutive of the plurality of internal clock signals that yielded different comparison results.

22. The method of claim 20, wherein generating the plurality of internal clock signals from the reference clock signal comprises generating each of the plurality of internal clock signals as a pulsed clock signal that is derived from a respective one of the bits of a value stored in the semiconductor memory device, wherein the stored value is changed on at least some of the cycles of the reference clock signal.

23. A circuit for estimating the frequency of an external clock signal, comprising:
a reference clock generation unit that is configured to output a reference clock signal that has a reference frequency;
a first accumulator operating in response to the reference clock signal that is configured to simultaneously output a plurality of pulse signals, wherein each of the plurality of pulse signals has a frequency that is a respective one of a plurality of predetermined multiples of the reference frequency; and
a plurality of comparison units that are each configured to compare a respective one of the plurality of pulse signals with the external clock signal to determine which of said signals has a higher frequency and to output a signal indicating the result of the comparison;
wherein the output signal from one or more of the plurality of comparison units provides an estimate of the frequency of the external clock signal.

24. The circuit of claim 23, further comprising a setting unit that is configured to provide a first code that is used to determine the frequencies of the plurality of pulse signals.

25. The circuit of claim 24, wherein the first accumulator comprises:
- a first register having an output which is used to form the plurality of pulse signals; and
- a first adder that is configured to sum the output of the first register and the first code in response to the reference clock signal and provide the resulting sum to the first register.

26. The circuit of claim 24, wherein the reference clock generator unit comprises:
- a bias voltage generation unit that includes a bandgap bias circuit that generates a bias voltage;
- a bias current generation unit that is configured to output a bias current in response to the bias voltage; and
- an oscillation unit that is configured to output the reference clock signal with a frequency that is set based on the bias current.

27. The circuit of claim 26, wherein the oscillation unit is a ring oscillator that includes a plurality of inverters connected to each other in series.

28. The circuit of claim 26, wherein the bias current generation unit is further configured to change the magnitude of the bias current in response to a bias code that is received from the setting unit.

* * * * *